US007124501B2

(12) United States Patent
Bender

(10) Patent No.: US 7,124,501 B2
(45) Date of Patent: Oct. 24, 2006

(54) METHOD OF PRODUCING AN ELECTRICAL PLUG-IN-CONNECTION

(75) Inventor: Günther Bender, Rodheim-Rosbach (DE)

(73) Assignee: Mannesmann VDO AG, Frankfurt (DE)

( * ) Notice: Subject to any disclaimer, the term of this patent is extended or adjusted under 35 U.S.C. 154(b) by 423 days.

(21) Appl. No.: 10/725,775

(22) Filed: Dec. 1, 2003

(65) Prior Publication Data

US 2004/0107567 A1 Jun. 10, 2004

Related U.S. Application Data

(62) Division of application No. 09/445,776, filed as application No. PCT/EP98/02901 on May 16, 1998, now abandoned.

(30) Foreign Application Priority Data

Jun. 10, 1997 (DE) ................................ 197 24 336

(51) Int. Cl.
*H05K 3/34* (2006.01)
*B23K 26/20* (2006.01)

(52) U.S. Cl. ............................ 29/840; 29/860; 29/861; 219/121.63; 219/121.64; 439/874

(58) Field of Classification Search .................. 29/840, 29/843, 860, 844, 861, 878, 879, 882; 439/164, 439/579, 874; 219/121.63, 121.64
See application file for complete search history.

(56) References Cited

U.S. PATENT DOCUMENTS

| | | | | |
|---|---|---|---|---|
| 4,168,875 | A | 9/1979 | Leonard, Jr. et al. | |
| 4,682,840 | A * | 7/1987 | Lockard | 439/874 |
| 4,790,775 | A * | 12/1988 | David | 439/579 |
| 5,683,259 | A * | 11/1997 | Sato | 439/164 |

FOREIGN PATENT DOCUMENTS

| | | | |
|---|---|---|---|
| DE | 3234059 | 3/1984 | |
| DE | 3708375 | 6/1988 | |
| DE | 3740339 | 6/1988 | |
| DE | 3921990 | 1/1990 | |
| DE | 4200492 | 4/1993 | |
| DE | 9300585 | 5/1993 | |
| FR | 2691293 | 11/1993 | |
| JP | 3-127476 | * 5/1991 | 29/860 |

* cited by examiner

*Primary Examiner*—A. Dexter Tugbang
(74) *Attorney, Agent, or Firm*—Martin A. Farber

(57) ABSTRACT

Method for producing an electrical connector connecting between a first and a second mating contact partner, wherein at least one contact partner is surrounded by a plug housing. The first and the second contact partners are lead with latching means together to form a plug-in electrical connection in the plug housing. Laser-welding is applied to the first and the second contact partners to make the connection an integral, non-detachable connection, by directing a laser beam through a single opening in the plug housing.

10 Claims, 1 Drawing Sheet

METHOD OF PRODUCING AN ELECTRICAL PLUG-IN-CONNECTION

RELATED APPLICATION

Figure 1:
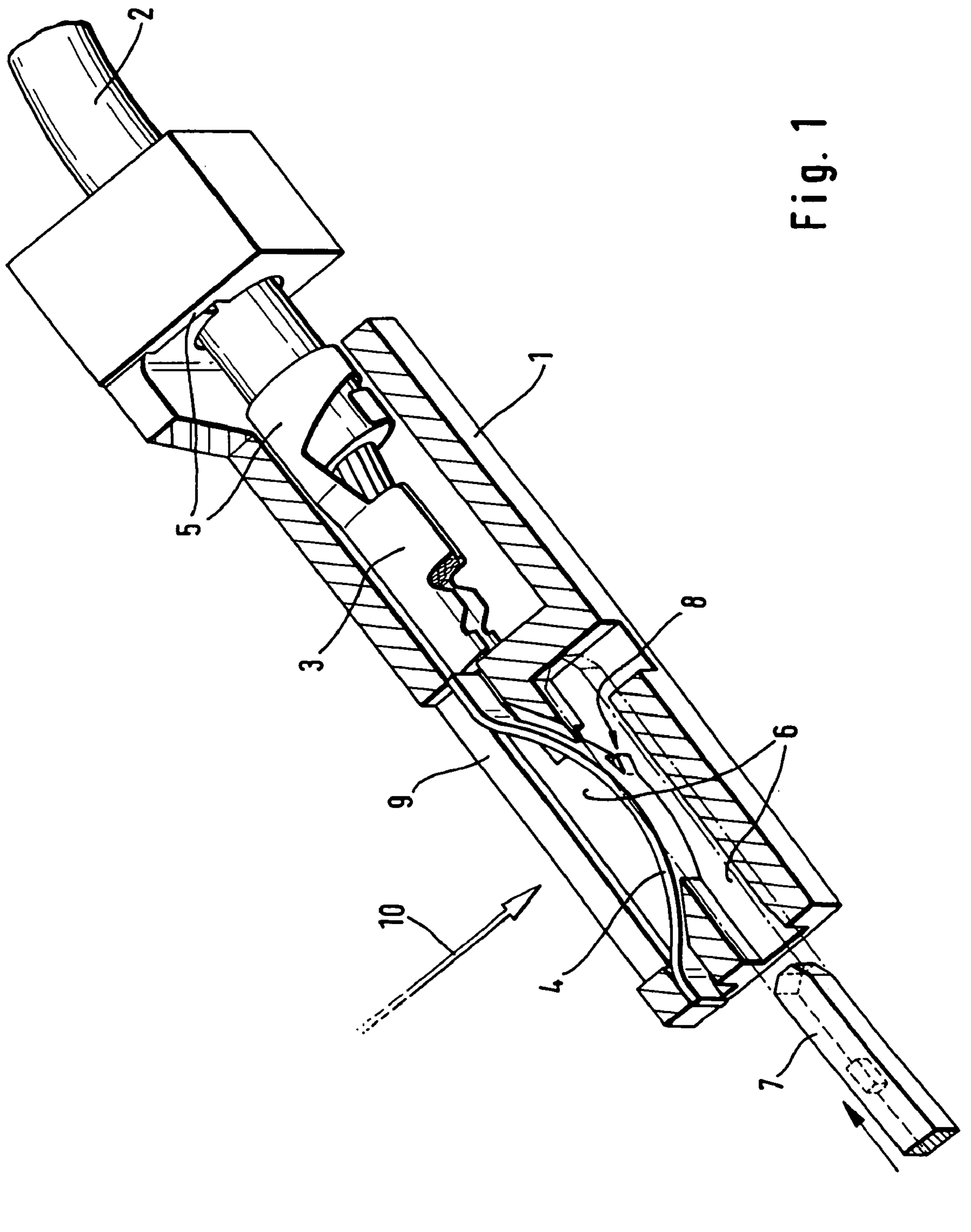

This application is a continuing divisional application of my application Ser. No. 09/445,776 filed Mar. 27, 2000 now abandoned, USA PCT National Stage Patent Application PCT/EP98/02901 filed May 16, 1998, the entire contents and disclosure of which are considered as being part of the disclosure of this continuing divisional application and are hereby incorporated by reference herein in their entirety.

FIELD AND BACKGROUND OF THE INVENTION

The invention relates to a method and a device for producing an electrical connection in accordance with the features of the respective precharacterizing clause of the independent patent claims.

Electrical connections in which a first contact partner is brought into connection with a second contact partner, for example by their being plugged together, are known. Such a plug-in connection is also detachable after being plugged together, this resulting, in particular in the event of severe mechanical vibration or shaking loading, in increased oxidation (frictional oxidation) with an increased contact resistance or even in detachment of the electrical connection and hence contact difficulties or even contact interruptions. At elevated ambient temperature, the ability of the connection to carry current is also reduced. Proposals for eliminating such contact difficulties merely comprise connecting the housings of the two contact partners to each other by mechanical locking means (for example snap-action closures) to prevent inadvertent detachment.

SUMMARY OF THE INVENTION

The invention is therefore based on the object of specifying a method and a device for producing an electrical connection which not only permits the connection to be produced in a manner that is easy to assemble, but also provides an extremely high degree of contact reliability.

This object is achieved by the features of the respective independent patent claims.

Surprisingly, it has transpired that conventional plug-in connections, such as banana plugs, flat-blade plugs or the like having one or more contact partners which are, in particular, arranged beside one another, are easy to assemble because of the simple plug-on operation, and, because of the subsequent integral or quasi-integral, non-detachable connection to each other, also provide an extremely high degree of contact reliability and a considerably reduced contact resistance. This means that an assembly process that is simple to carry out is proposed, this process offering the advantage of leading the two contact partners together either manually or mechanically and then connecting them to each other in an integral or quasi-integral manner, it also being possible for this connection to be carried out manually or mechanically. Such a method and such a device are used primarily where the electrical connection is exposed to vibration and/or shaking loading, or else where contact problems may also arise as a result of other ambient conditions (such as severe temperature fluctuations, elevated ambient temperature or the like).

The invention is therefore based on the basic idea of modifying a connection that is initially detachable per se and has the advantage of simple, accurate, transposition-safe and rapid assembly, in such a way that, following the modification (integral or quasi-integral connection) this connection becomes non-detachable, in order to ensure a high degree of contact reliability. This also has the advantage that the method may be automated, in particular within the context of mass production.

In a development of the invention, the integral connection is produced by laser welding, resistance welding or brazing—that is to say in general by specific, brief heating of the connection point. The use of the above-mentioned connection options depends, in particular, on the nature of the material or the material pairing of the two contact partners and, in addition, on the conditions of use. The connection is advantageously carried out after the contact partners have been plugged together, since at least one contact partner is fixed in position (for example a plug on a printed circuit board).

In a development of the invention, it is possible for the quasi-integral connection to be produced by crimp or clamp connections. Such a connection is considered, in particular, when the two contact partners are freely accessible and are not surrounded by a housing.

In a development of the invention, one contact partner is inserted into a contact guide in the region of the other contact partner in a plug housing, and the integral or quasi-integral connection is produced through an opening in the plug housing. This offers the advantage that the electrical connection can be pre-assembled and then inserted into a component group, into a housing or the like.

In a development of the invention, the integral or the quasi-integral connection is produced within this component group or the housing. This makes it possible, within a component group or within a housing, to connect a plurality of modules, components or the like electrically to one another by leading the two contact partners together as a plug-in connection and then to produce the integral or the quasi-integral connection within this component group. In this case, consideration is also given not only to the fact that modules or components within this component group are connected to one another, but also that feed lines from the outside or to the outside are connected to one or more modules. This dispenses with the awkward, combined assembly of modules which have already been pre-assembled and electrically connected and which would have to be akward to insert into the housing.

BRIEF DESCRIPTION OF THE SOLE FIG. DRAWING

The features of the device claims, from which advantageous effects also emerge, are described below and explained with reference to FIG. 1.

FIG. 1 shows a preferred configuration of an electrical connection according to the invention, although the general idea of the invention is not restricted thereto.

DETAILED DESCRIPTION OF THE PREFERRED EMBODIMENT

The reference number 1 designates a plug housing, at whose one end there is a cable 2. Arranged inside the plug housing 1 is a first contact partner 3 (for example a plug or socket), the first contact partner 3 being configured in such a way that the cable 2 is fastened to it, for example by means of a conventional crimp connection, and having a contact tab 4 in the region remote from the cable 2. The strain on the cable 2 is relieved in a manner known per se via strain-relief elements 5 on the contact partner 3 and/or on the plug housing 1. This is advantageous both during the connection process and during operation, since the connection point is then largely free of forces, in spite of vibration and shaking loading.

The plug housing 1 also has a contact guide 6, a second contact partner 7 (for example a socket or plug), which can also be connected to a cable, a printed circuit board or the like, being inserted into this contact guide 6 (indicated by the arrow in the second contact partner 7). The contact guide 6 also serves to reduce the degrees of freedom (positioning aid) of the second contact partner 7. In order to increase the reliability of assembly and for the purpose of the first mechanical fixing of the second contact partner 7, a latching means 8 is arranged in the plug housing 1 and, following the insertion of the second contact partner 7 into the contact guides 6, fixes the second contact partner. Such a latching means may alternatively also be present on the second contact partner 7. As an alternative to this, it is possible (as is also indicated in FIG. 1) for the second contact partner 7 to be fixed in position by means of the action of force (spring action) following its insertion into the contact guides 6. To this end, FIG. 1 illustrates that the contact tab 4 is arcuately curved and thus exerts pressure on the second contact partner 7, this ensuring that, during the connection process, the two contact partners 3, 7 are in contact with each other and the connection (welding) takes place in this region. The latching means 8 may also be arranged in the region of the contact tab 4. Such a latching means is advantageous in particular in the case of manual assembly, since, for example, the latching-in noise signals that the second contact partner 7 has reached its intended position (shown by dashed lines).

Once this intended position has been reached by inserting the second contact partner into the contact guide 6, the integral connection is carried out through an opening 9 in the plug housing 1 by means of a laser beam 10, which then connects the irradiated subregion of the contact tab 4 integrally to that region of the second contact partner 7 which is also arranged in this region. If there is a latching means in this region, it may be fused by the laser beam 10 or the like.

The plug housing 1 (or else an appropriately shaped socket housing) is designed to accommodate just one contact partner 3, including its associated other contact partner 7. Of course, it is also conceivable for a plurality of contact partners 3 (or 7) to be arranged beside and/or above one another and/or also in a curved, circular and/or cube shape in the plug housing, and for the associated openings 9 to be accessible from the outside. It is also conceivable to cover the opening(s) 9 after the connection process has been carried out.

The idea of the invention can, in principle, be used for electrical plug-in connections in which simple, rapid assembly and a high degree of contact reliability are required. A particular field of application, although the invention is not restricted to this, is the field of actuating devices for setting the output of internal combustion engines, which are usually referred to as E-Gas. In the case of such actuating devices, the power supply to the actuating motor is produced by means of the electrical connection and the cable arranged thereon, but the position of the throttle, which is registered, for example, by means of a throttle potentiometer or the like, is also fed back to a control device. Thus, for example, the cables for the power supply and for the feedback are inserted into the housing of the actuating device and, by means of the plug-in connection according to the invention, the electrical connection to the throttle potentiometer or the like and/or to the actuating motor is produced. It is advantageous here, also from the point of view of the small amount overall space required, for at least one plug housing to be plugged onto the contact tabs of the throttle potentiometer and/or the actuating motor and then for the integral or the quasi-integral connection to be produced by means of the laser welding or the like. This may be carried out manually or mechanically, in particular inside the housing. As a result, in the case of such actuating devices which are located in the engine compartment of a vehicle and are hence subjected to high shaking and/or vibration loading and to severe temperature fluctuations, this plug-in connection makes a reliable contact which is extremely important in particular in the operation of vehicles.

LIST OF REFERENCE SYMBOLS

1. Plug housing
2. Cable
3. First contact partner
4. Contact tab
5. Strain-relief element
6. Contact guides
7. Second contact partner
8. Latching means
9. Opening
10. Laser beam

The invention claimed is:

1. Method for producing an electrical connection between a first and a second mating contact partner, comprising: surrounding the first contact partner by a plug housing, leading the second contact partner via a contact guide of the plug housing to the first contact partner to form a plug-in electrical connection in said plug housing, said step of leading being accomplished by a latching of the second contact to the first contact, and a following step of laser-welding the first and the second contact partners to make said connection an integral, non-detachable connection between them, wherein a laser beam of said laser welding is directed through a single opening in said plug housing to provide for the laser welding of the contact partners.

2. Method according to claim 1, wherein the plug-in connection is produced by crimp or clamp connections.

3. Method according to claim 1, wherein one of the contact partners is inserted into the contact guide in a region of the other of the contact partners in the plug housing.

4. Method according to claim 1, wherein the plug-in connection is produced within a component group.

5. Method according to claim 1, wherein the plug-in connection is produced and then inserted into a component group.

6. Method for producing an electrical connection between a first and a second mating contact partner, comprising: surrounding the first contact partner by a plug housing, providing a single opening in the housing for admission of a laser beam, leading the second contact partner via a contact guide of the plug housing to the first contact partner to form a plug-in electrical connection in said plug housing, said step of leading being accompanied by a latching of the second contact to the first contact, and welding the first and the second contact partners to make said connection an integral, non-detachable connection between them, wherein the welding is accomplished by directing the laser beam through the single opening in said plug housing to provide for a laser welding of the contact partners.

7. Method according to claim 6, wherein the plug-in connection is produced by crimp or clamp connections.

8. Method according to claim 6, wherein one of the contact partners is inserted into the contact guide in a region of the other of the contact partners in the plug housing.

9. Method according to claim 6, wherein the plug-in connection is produced within a component group.

10. Method according to claim 6, wherein the plug-in connection is produced and then inserted into a component group.

* * * * *